(12) United States Patent
Kim et al.

(10) Patent No.: US 6,313,510 B1
(45) Date of Patent: Nov. 6, 2001

(54) INTEGRATED CIRCUITS INCLUDING METAL SILICIDE CONTACTS EXTENDING BETWEEN A GATE ELECTRODE AND A SOURCE/DRAIN REGION

(75) Inventors: Sung-bong Kim; Kyeong-tae Kim, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/702,530

(22) Filed: Oct. 31, 2000

Related U.S. Application Data

(62) Division of application No. 09/137,598, filed on Aug. 21, 1998, now Pat. No. 6,169,020.

(30) Foreign Application Priority Data

Aug. 22, 1997 (KR) ................................. 97-402347

(51) Int. Cl.$^7$ .......................... H01L 29/76; H01L 29/97; H01L 31/062
(52) U.S. Cl. .......................... 257/382; 257/344; 257/368; 257/369; 257/382; 257/383; 257/384; 257/388; 257/408; 257/412; 257/413; 257/900
(58) Field of Search .................................. 257/344, 368, 257/369, 382–384, 388, 408, 412, 413, 900, 903, 904

(56) References Cited

U.S. PATENT DOCUMENTS

| | | | |
|---|---|---|---|
| 4,912,540 | 3/1990 | Sander et al. | 357/59 |
| 5,387,535 | 2/1995 | Wilmsmeyer | 437/57 |
| 5,521,113 | 5/1996 | Hsue et al. | 437/52 |
| 5,635,426 | 6/1997 | Hayashi et al | 438/453 |
| 5,913,139 | 6/1999 | Hashimoto et al. | 438/618 |
| 5,989,996 | * 11/1999 | Kishi | 438/621 |
| 6,015,730 | 1/2000 | Wang et al. | 438/241 |
| 6,153,457 | * 11/2000 | Kuo | 438/233 |

FOREIGN PATENT DOCUMENTS

0405293 * 1/1991 (EP) .

* cited by examiner

Primary Examiner—Nathan Flynn
Assistant Examiner—Ahmed N. Sefer
(74) Attorney, Agent, or Firm—Myers Bigel Sibley & Sajovec

(57) ABSTRACT

The presence and absence of sidewall spacers are used to provide discontinuous and continuous contacts respectively, between a gate electrode and a source/drain region. In particular, first and second spaced apart gate electrodes are formed on an integrated circuit substrate. A source/drain region is formed in the integrated circuit substrate therebetween. The first electrode includes a first sidewall spacer on a first sidewall thereof facing the second gate electrode. The second gate electrode is free of (i.e. does not include a sidewall spacer on a second sidewall thereof facing the first electrode. A metal silicide layer is formed on the first gate electrode, on the second gate electrode and extending from the second gate electrode onto the second sidewall and onto the source/drain region. The first sidewall spacer is free of the metal silicide layer thereon. The metal silicide layer is preferably formed by forming a metal layer on the first gate electrode, on the first sidewall spacer, on the source/drain region, on the second sidewall and on the second gate electrode. The metal layer is reacted with the first gate electrode, the source/drain region, the second sidewall and the second gate layer, to thereby form the metal silicide layer on the first gate electrode, on the second gate electrode and extending from the second gate electrode onto the second sidewall and onto the source/drain region. The metal layer is then removed from the first sidewall spacer.

12 Claims, 3 Drawing Sheets

INTEGRATED CIRCUITS INCLUDING METAL SILICIDE CONTACTS EXTENDING BETWEEN A GATE ELECTRODE AND A SOURCE/DRAIN REGION

This application is a divisional of prior application Ser. No. 09/137,598 filed on Aug. 21, 1998, now U.S. Pat. No. 6,169,020.

FIELD OF THE INVENTION

This invention relates to methods of fabricating integrated circuits and integrated circuits fabricated thereby, and more particularly to methods of fabricating integrated circuits including metal silicide contacts and integrated circuits fabricated thereby.

BACKGROUND OF THE INVENTION

As the integration density of integrated circuit devices continues to increase, it may become increasingly difficult to form contacts or interconnections between the highly integrated regions of the integrated circuit. Accordingly, many contact technologies have been developed for connecting regions in an integrated circuit.

One type of contact technology is referred to as "butted contact" or "butting contact" technology. Butted contact structures and methods may be used to form an electrical connection between doped regions in an integrated circuit substrate and one or more conductive polysilicon layers on the integrated circuit substrate. Butted contact structures and methods may be employed in Static Random Access Memory (SRAM) cells wherein an electrical connection is formed between a polysilicon gate and a source/drain region in an integrated circuit substrate. Butted contacts are described in U.S. Pat. No. 4,912,540 to Sander et al., U.S. Pat. No. 5,387,535 to Wilmsmeyer and U.S. Pat. No. 5,521,113 to Hsue et al.

FIGS. 1 through 4 illustrate a conventional method for fabricating a butted contact.

FIG. 1 is a cross-sectional view illustrating a step of forming an isolation film 3 (often referred to as a field oxide), first and second gate electrodes 7a and 7b, and a, Lightly Doped Drain (LDD) region 9. In detail, the isolation film 3 that defines active and inactive regions is formed in a predetermined area of an integrated circuit substrate such as a silicon semiconductor substrate 1. Then, a gate oxide layer 5 is formed on the surface of the active region between the isolation films 3. First and second gate electrodes 7a and 7b are formed on a predetermined area of the resultant structure having the gate oxide layer 5.

The first gate electrode 7a may correspond to the gate electrode of an access transistor of an SRAM cell, and may form a word line. The second gate electrode 7b may correspond to a gate electrode of a driver transistor of the SRAM cell. However, the first and second gate electrodes need not correspond to SRAM cell regions.

The first and second gate electrodes 7a and 7b may comprise doped polysilicon. Impurity ions are implanted into the surface of the substrate 1 using the first gate electrode 7a, the second gate electrode 7b and the isolation film 3 as a mask, thereby forming the LDD region 9 on the surface of the active region.

FIG. 2 is a cross-sectional view illustrating a step of forming a sidewall spacer 11 and a source/drain region 14. First, an oxide or nitride layer is formed on the entire surface of the resultant structure having the LDD region 9, and anisotropically etched to form the sidewall spacers 11 at the sidewalls of the first and second gate electrodes 7a and 7b. The surface of the LDD region 9 may be exposed by overetching the oxide or nitride layer to form the sidewall spacers 11. Then, impurity ions having the same conductivity as that of the LDD region 9 are implanted onto the surface of the silicon substrate 1 using the isolation film 3, the sidewall spacer 11 and the first and second gate electrodes 7a and 7b as a mask, thereby forming a heavily doped impurity region 13 having a higher concentration than that of the LDD region 9. The LDD region 9 and the heavily doped impurity region 13 form the source/drain region 14 of the transistor.

FIG. 3 is a cross-sectional view illustrating a step of forming first, second and third metal silicide layers 16a, 16b and 16c, and a butted contact hole H. A refractory metal layer is formed on the surface of the resultant structure having the source/drain region 14. A thermal treatment is then performed at a predetermined temperature, thereby simultaneously forming the first and second metal silicide layers 16a and 16b on the respective first and second gate electrodes 7a and 7b, and the third metal silicide layer 16c on the source/drain region 14. The refractory metal layer formed on the sidewall spacers 11 and the isolation film 3 does not react to form metal silicide because it is not on a silicon or polysilicon surface. The unreacted refractory metal layer is removed using a chemical solution.

An interlayer dielectric (ILD) film 18, such as a silicon dioxide layer, is then formed on the resultant structure from which the unreacted refractory metal layer has been removed. The ILD film is then patterned to form a butted contact hole H which exposes the second metal silicide layer 16b and the source/drain region 14 adjacent thereto. Unfortunately, if the sidewall spacer 11 is formed of a material having an etching selectivity with respect to the ILD film 18, the sidewall spacer 11 exposed by the butted contact hole 11 remains as shown in FIG. 3, so that the aspect ratio of the butted contact hole 11 may increase. In addition, the sidewall spacer 11 may limit the area of the source/drain region 14 exposed by the butted contact hole H. Finally, a polymer obtained during the etching step of forming the butted contact hole H may be absorbed at the bottom of the butted contact hole H, which may increase the butted contact resistance.

In order to solve these problems, if the sidewall spacer 11 is formed of a material which is the same as the ILD film 18 (such as silicon dioxide), the sidewall spacer 11 formed on the sidewall of the second gate electrode 7b may be removed during the overetching step in forming the butted contact hole H. Unfortunately, the LDD region beneath the removed sidewall spacer 11 may be exposed, so that the third metal silicide layer 16c may grow to a junction portion of the source/drain region 14 in a subsequent annealing step. Accordingly, the junction leakage current of the source/drain region 14 may increase.

FIG. 4 is a cross-sectional view illustrating the step of forming an interconnection 20. In detail, a conductive layer is formed on the resultant structure having the butted contact hole H, and then patterned to form an interconnection 20 covering the butted contact hole H. Such a formed interconnection 20 connects the second gate electrode 7b and the source/drain region 14 adjacent thereto. Unfortunately, as described above, it may be difficult to increase the area of the source/drain region exposed by the butted contact hole, or to improve the junction leakage current of the source/drain region.

SUMMARY OF THE INVENTION

It is therefore an object of the present invention to provide improved metal silicide contacts extending between a gate electrode and a source/drain region and methods of fabricating same.

It is another object of the present invention to provide improved contacts extending between a gate electrode and a source/drain region that can increase the area of the source/drain region that is contacted and that can reduce the junction leakage current of the source/drain region, and methods of fabricating the same.

These and other objects are provided according to the present invention, by using the presence and absence of sidewall spacers to provide discontinuous and continuous contacts respectively, between a gate electrode and a source/drain region. In particular, according to the present invention, first and second spaced apart gate electrodes are formed on an integrated circuit substrate. A source/drain region is formed in the integrated circuit substrate therebetween. The first gate electrode includes a first sidewall spacer on a first sidewall thereof facing the second gate electrode. The second gate electrode is free of (i.e. does not include) a sidewall spacer on a second sidewall thereof facing the first electrode. A metal silicide layer is formed on the first gate electrode, on the second gate electrode and extending from the second gate electrode onto the second sidewall and onto the source/drain region.

The first sidewall spacer is free of the metal silicide layer thereon.

The first and second spaced apart gate electrodes are preferably formed by forming first and second spaced apart gate electrodes on the integrated circuit substrate and a source/drain region in the integrated circuit substrate therebetween. A first sidewall spacer is formed on a first sidewall of the first gate electrode facing the second gate electrode and a second sidewall spacer is formed on a second sidewall of the second gate electrode facing the first electrode. The second sidewall spacer is then removed from the second sidewall. The metal silicide layer is preferably formed by forming a metal layer on the first gate electrode, on the first sidewall spacer, on the source/drain region, on the second sidewall and on the second gate electrode. The metal layer is reacted with the first gate electrode, the source/drain region, the second sidewall and the second gate layer, to thereby form the metal silicide layer on the first gate electrode, on the second gate electrode and extending from the second gate electrode onto the second sidewall and onto the source/drain region. The metal layer is then removed from the first sidewall spacer.

Lightly and heavily doped source/drain regions may be formed as part of the contact forming methods. In particular, between the step of forming first and second spaced apart gate electrodes and the step of forming a first sidewall spacer and a second sidewall spacer, a lightly doped source/drain region is formed in the integrated circuit substrate between the first and second sidewalls. After the removing step, a heavily doped source/drain region is formed in the integrated circuit substrate between the first sidewall spacer and the second sidewall.

The metal silicide layer is preferably formed in a two-phase reaction. When the metal is titanium, the titanium layer is annealed at a first temperature, to thereby form a titanium silicide layer of C-49 phase on the first gate electrode, on the second gate electrode, and extending from the second gate electrode onto the second sidewall and onto the source/drain region. The second sidewall spacer is then removed from the second sidewall. A second anneal is then performed of the titanium silicide layer of C-49 phase at a second temperature, to thereby form a titanium silicide layer of C-54 phase on the first gate electrode, on the second gate electrode and extending from the second gate electrode onto the second sidewall and onto the source/drain region. The first temperature is preferably between about 620° C. and about 680° C. The second temperature is preferably between about 750° and about 850° C.

Alternatively, when the metal is cobalt, the cobalt layer is annealed at a first temperature, preferably between about 440° and about 470° C. to obtain a metastable phase having relatively high resistivity. After removing the second sidewall spacer from the second sidewall, a second anneal is performed at a second temperature, preferably between about 750° and about 850° C. to obtain a stable phase having relatively low resistivity. Other metals including but not limited to platinum, palladium and nickel may also be used.

After forming the metal silicide layer, a conductive plug may be formed that electrically contacts the metal silicide layer on the second gate electrode, on the second sidewall and on the source/drain region. Accordingly, the heavily doped source/drain region and the second gate electrode are electrically connected by the metal silicide layer, thereby allowing reduction in butted contact resistance. Also, the heavily doped source/drain region is formed after removing the second sidewall spacer, so that the second gate electrode and the heavily doped source/drain region can overlap each other. Accordingly, the growth of a metal silicide layer at the junction portion of the heavily doped impurity layer during subsequent annealing can be reduced and preferably eliminated. The junction leakage current of the heavily doped source/drain layer can therefore be reduced.

Integrated circuit devices according to the present invention may also be formed without the use of the sidewall spacers by forming first and second spaced apart gate electrodes on an integrated circuit substrate and a source/drain region in the integrated circuit substrate therebetween. The first gate electrode includes a first sidewall facing the second gate electrode. The second gate electrode includes a second sidewall facing the first gate electrode. A metal silicide layer is then formed on the first gate electrode, on the second gate electrode and extending from the second gate electrode onto the second sidewall and onto the source/drain region. The first sidewall is free of the metal silicide layer thereon. For example, the metal silicide layer can be removed by selective etching.

Integrated circuits according to the present invention include an integrated circuit substrate and first and second spaced apart gate electrodes on the integrated circuit substrate. The first gate electrode includes a first sidewall facing the second gate electrode, and the second gate electrode includes a second sidewall facing the first gate electrode. A source/drain region is included in the integrated circuit substrate between the first and second spaced apart gate electrodes. A first sidewall spacer is on the first sidewall. The second sidewall is free of a sidewall spacer thereon. A metal silicide layer is included on the first gate electrode, on the second gate electrode, and extending from the second gate electrode onto the second sidewall and onto the source/drain region. The first sidewall spacer is free of the metal suicide layer thereon.

The source/drain region may include a lightly doped source/drain region in the integrated circuit substrate between the first and second sidewalls and a heavily doped source/drain region in the integrated circuit substrate between the first sidewall spacer and the second sidewall. The integrated circuit substrate preferably comprises silicon, the first and second gate electrodes preferably comprise polysilicon and the first sidewall spacer preferably comprises at least one of silicon dioxide and silicon nitride. The metal silicide layer preferably comprises at least one of titanium, cobalt, platinum, palladium and nickel silicide, the titanium silicide most preferably of C-54 phase. A conductive plug may also be included that electrically contacts the metal silicide layer on the second gate electrode on the second sidewall and on the source/drain region. Integrated circuits according to the invention may not include the first sidewall spacer, so that the metal silicide layer is on the first gate electrode, on the second gate electrode and extending from the second gate electrode onto the second sidewall and onto the source/drain regions, with the first sidewall being free of the metal silicide layer thereon. High performance integrated circuit devices and fabrication methods may thereby be provided.

DETAILED DESCRIPTION OF PREFERRED EMBODIMENTS

Figure 1:
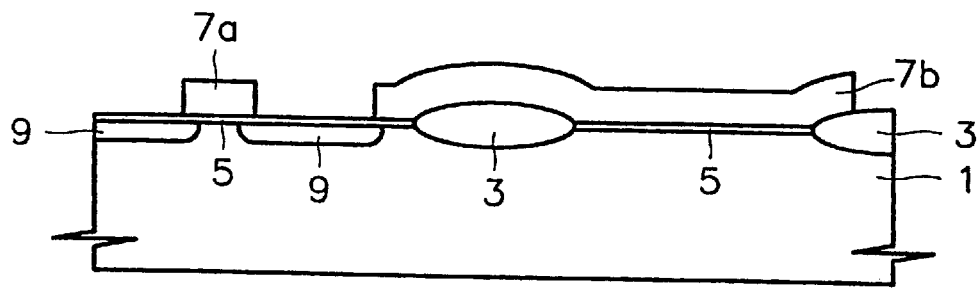
FIGS. 1 through 4 are cross-sectional views illustrating a conventional method or forming a butted contact hole.
Figure 2:
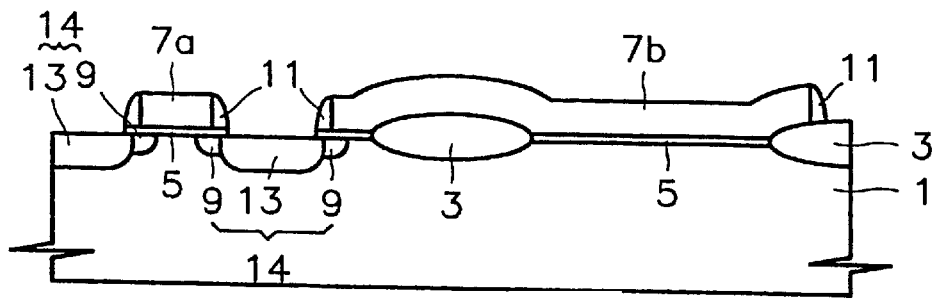
Figure 3:
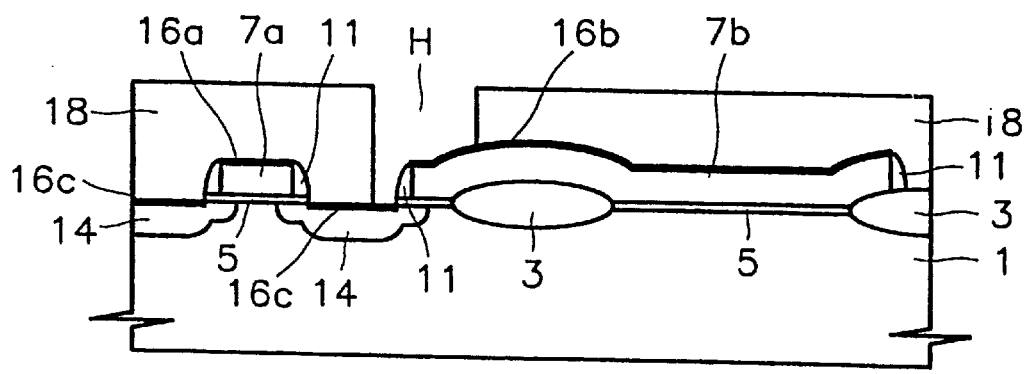
Figure 4:
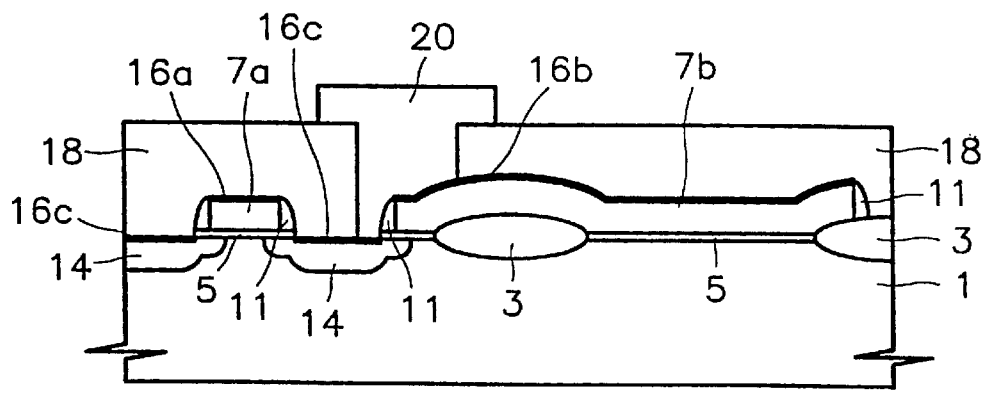

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. Moreover, each embodiment described and illustrated herein includes its complementary conductivity type embodiment as well.

A preferred embodiment of the present invention will be described in detail with reference to the appended drawings, based on an example of an SRAM cell. However, the present invention is not limited to an SRAM cell, and can be applied to other contact technologies for integrated circuits.

Figure 5:
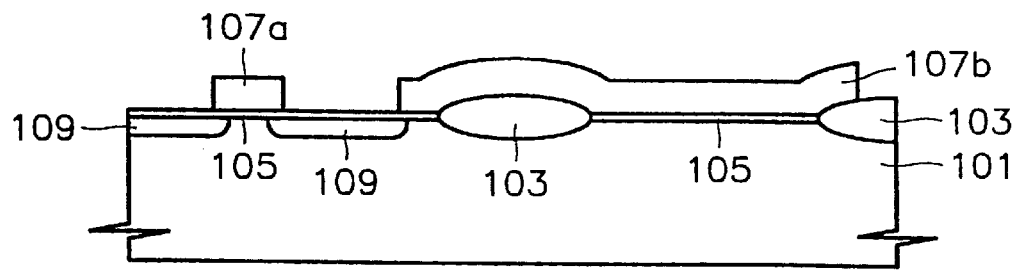
FIGS. 5 through 9 are cross-sectional views illustrating methods for fabricating integrated circuits according to the present invention and integrated circuits so fabricated.

FIGS. 5 through 9 illustrate methods of fabricating integrated circuits according to the present invention. In detail, FIG. 5 is a cross-sectional view illustrating a step of forming an isolation film 103, a gate dielectric film 105, first and second gate electrodes 107a and 107b, and a Lightly Doped Drain (LDD) region 109.

First, isolation films 103 that define active and inactive regions are formed in a predetermined area of an integrated circuit substrate 101, such as a silicon semiconductor substrate, for example by a conventional local oxidation of silicon (LOCOS) method. The isolation films 103 also may be formed by a trench isolation method or other method. Then, a gate dielectric film 105 is formed on the surface of the active region defined by the isolation film 103. The gate dielectric film 105 preferably is formed of a thin thermal oxide layer to a thickness of between about 50 Å and about 150 Å.

Then, a conductive layer, preferably comprising doped polysilicon, is formed on the resultant structure having the gate dielectric film 105, and then patterned to form the first and second gate electrodes 107a and 107b covering a predetermined area of the active region. The first gate electrode 107a includes a first sidewall facing the second gate electrode 107b, and the second gate electrode 107b includes a second sidewall facing the first gate electrode 107a.

The first and second gate electrodes 107a and 107b may correspond to the gate electrodes of an access transistor and a driver transistor, respectively, of an SRAM cell. The gate electrode 107a of the access transistor also may act as a word line of the SRAM cell. The active region between the first and second gate electrodes 107a and 107b may be a region in which a node contact of an SRAM cell, e.g., a butted contact, is to be formed.

Continuing with the description of FIG. 5, impurities (dopants) having different conductivity from that of the substrate 101 are implanted into the active region using the first and second gate electrodes 107a and 107b and the isolation film 103 as a mask, thereby forming the LDD region 109 having a higher impurity concentration than the semiconductor substrate 101. A source/drain region corresponding to the second gate electrode 107b is not shown.

Figure 6:
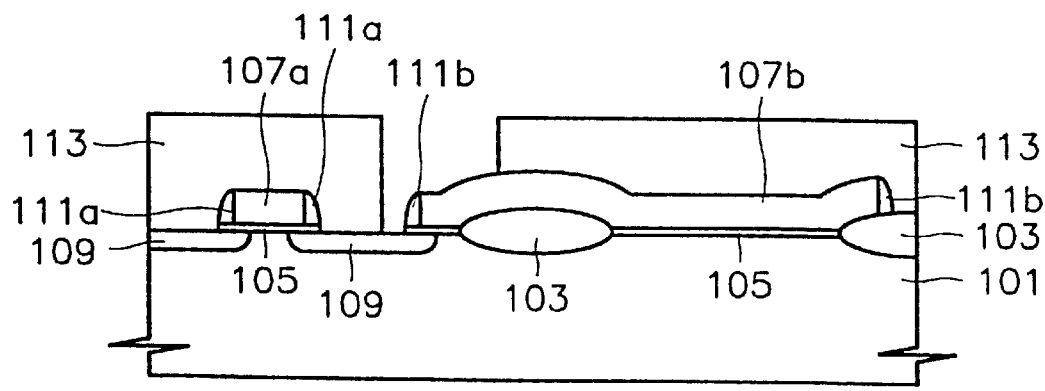

FIG. 6 is a cross-sectional view illustrating a step of forming first and second sidewall spacers 111a and 111b and a photoresist pattern 113. In detail, an insulation film, including for example a silicon oxide layer and/or a silicon nitride layer, is formed on the resultant structure having the LDD region 109, for example by chemical vapor deposition. Next, the insulation film is anisotropically etched to form the first and second sidewall spacers 111a and 111b on the sidewalls of the first and second gate electrodes 107a and 107b, respectively. Then, a photoresist layer is coated on the resultant structure having the first and second sidewall spacers 111a and 111b. The photoresist layer is patterned by a photolithography process using a butted contact mask, thereby forming a photoresist pattern 113 which exposes the LDD region 109 formed in the active region between the first and second gate electrodes 107a and 107b, and the second sidewall spacer 111b adjacent thereto.

Figure 7:
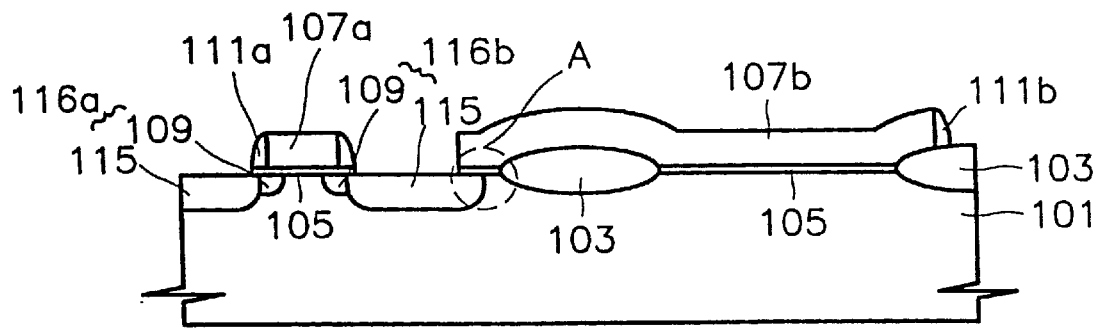

FIG. 7 is a cross-sectional view illustrating a step of forming first and second source/drain regions 116a and 116b. In detail, the exposed second sidewall spacer 111b is removed by etching using the photoresist pattern 113 as an etching mask. The exposed second sidewall spacer 111b can be etched by a dry or wet etching process. Wet etching may be preferred because the surface of the LDD region 109 adjacent the exposed second sidewall spacer 111b may be damaged if the exposed second sidewall spacer 111b is etched by dry etching. Then, the photoresist pattern 113 is removed.

Impurities having the opposite conductivity from that of the substrate 101 are implanted using the first and second gate electrodes 107a and 107b, the first sidewall spacer 111a, and the isolation film 103 as a mask, thereby forming a heavily doped layer 115 in the surface of the active region, having higher impurity concentration than the LDD region 109. When such high-concentration impurity layer 115 is formed, the source/drain regions 116a and 116b, each including a lightly doped region 109 and a heavily doped source/drain region 115, are formed in both active regions near the first gate electrode 107a, as shown in FIG. 7. The source/drain region 116b formed in the active region between the first and second gate electrodes 107a and 107b may act as a drain region of an SRAM driver transistor.

The source/drain region 116b is formed after the second sidewall spacer 111b is removed. Thus, the source/drain region 116b extends beneath the edge of the second gate electrode 107b, due to the diffusion of the heavily doped source/drain region 115. As a result, the second gate electrode 107b and the source/drain region 116b overlap at a portion A. In general, the heavily doped source/drain region 115 has a higher concentration than the LDD region 109. Thus, when a thermal process is performed, the source/drain region 116b overlapping with the second gate electrode 107b may have a considerable depth. The distance between a portion at which the side wall of the second gate electrode 107b contacts the surface of the source/drain region 116b, and the junction portion of the source/drain region 116b, also may be increased compared to conventional structures.

Figure 8:
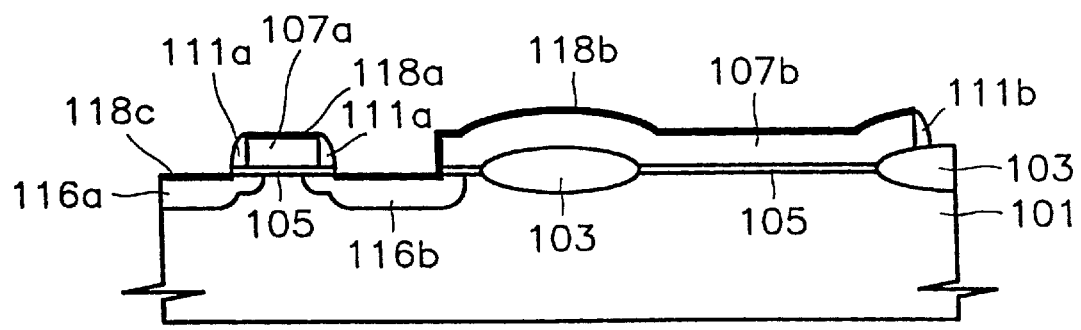

FIG. 8 is a cross-sectional view illustrating a step of forming metal silicide layers 118a, 118b and 118c. In detail, the surface of the resultant structure having the source/drain regions 116a and 116b may be cleaned, to expose the surface of the first and second gate electrodes 107a and 107b and the surface of the source/drain regions 116a and 116b. The sidewall of the second gate electrode 107b adjacent to the drain region 116b is also exposed. Then, a refractory metal layer, such as a titanium (Ti) layer, a cobalt (Co) layer, a platinum (Pt) layer, a palladium (Pd) layer and/or a nickel (Ni) layer, is formed on the resultant structure.

Then, the resultant structure having a titanium layer is heated at a first temperature in the range between about 620° C. and about 680° C. in a first annealing step, such that the titanium silicide layers 118a, 118b and 118c are selectively formed only on the surface of the first and second gate electrodes 107a and 107b and on the surface of the source/drain regions 116a and 116b. The titanium silicide layers 118a, 118b and 118c formed in the first annealing step preferably have a C-49 phase. The titanium layer formed on the first and second spacers 111a and 111b and the isolation film 103 remains without being reacted during the first annealing step. The unreacted titanium layer is selectively removed using a chemical solution such as sulfuric acid. As a result, the first gate electrode 107a and the source/drain regions 116a and 116b are electrically isolated, and isolation among adjacent transistors is also achieved. Next, the titanium silicide layers 118a, 118b and 118c having the C-49 phase are heated at a second temperature in the range between about 750° C. and about 850° C. in a second annealing step, to form the titanium silicide layers 118a, 118b and 118c having a C-54 phase.

When the phase of the titanium silicide layer is changed from the C-49 phase to the C-54 phase by the second annealing step, the resistance of the titanium silicide layers 118a, 118b and 118c can be reduced. As a result, the electrical resistance of the word line and the current drive capability of the transistors of the SRAM cell can be improved. Moreover, since the gate dielectric film 105 may be very thin, for example 150 Å or less, the source/drain region 116b formed between the first and second gate electrodes 107a and 107b is connected to the second gate electrode 107b by the butted metal silicide layer 118b. The junction leakage current characteristics need not deteriorate even though the butted metal silicide layer 118b grows in a subsequent annealing process. A reason for this is that the distance from the butted metal silicide layer 118b to the junction portion of the drain region 116b in the region A in which the second gate electrode 107b and the drain region 116b overlap, may be longer compared to conventional structures, as was described with reference to FIG. 7.

When the metal layer is cobalt, the cobalt layer is annealed at a first temperature, preferably between about 440° and about 470° C. to obtain a metastable phase having relatively high resistivity. After removing the second sidewall spacer from the second sidewall, a second anneal is performed at a second temperature, preferably between about 750° and about 850° C. to obtain a stable phase having relatively low resistivity. Other metals including but not limited to platinum, palladium and nickel may also be used.

Figure 9:
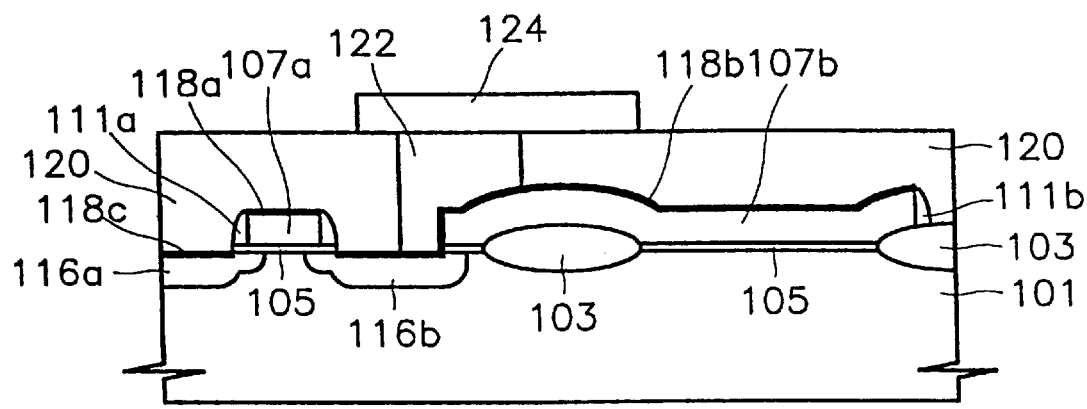

FIG. 9 is a cross-sectional view illustrating a step of forming a plug pattern 122 filling a butted contact hole, and an interconnection 124. In detail, an ILD film, such as a silicon dioxide layer, is formed on the resultant structure after the second annealing step. Then, the ILD film is patterned using a butted contact mask, to form an ILD film pattern 120 having a butted contact hole exposing a predetermined area of the butted metal silicide layer 118b. Next, a conductive layer filling the butted contact hole, such as doped polysilicon layer and/or tungsten layer, is formed on the surface of the ILD film pattern 120. Before the conductive layer is formed, a barrier metal film, such as a titanium nitride (TiN) layer may be formed on the resultant structure having the ILD film pattern 120. Subsequently, the conductive layer is planarized by blanket etching using an etch-back process and/or a Chemical Mechanical Polishing (CMP) process until the surface of the ILD film pattern 120 is exposed, thereby forming a plug pattern 122 in the butted contact hole. Then, an interconnection 124 covering the plug pattern 122 is formed.

Integrated circuits according to the present invention will now be described with reference to FIG. 9. Referring to FIG. 9, integrated circuits according to the present invention include the isolation film 103 in a predetermined area of the substrate 101 to define the first and second spaced gate electrodes 107a and 107b in the active region and including the respective first and second gate sidewalls, the first and second sidewall spacers 111a and 111b at the respective sidewalls of the first and second gate electrodes 107a and 107b, the source/drain region 116b in the surface of the active region between the first and second gate electrodes 107a and 107b, and the metal silicide layer 118b electrically connecting the drain region 116b and the second gate electrode 107b.

The second spacer 111b is not present on the second sidewall of the second gate electrode 111b facing the first gate electrode 111a. Thus, as shown in FIG. 9, the metal silicide layer 118b is also present on the second sidewall of the second gate electrode 107b adjacent to the source/drain region 116b. Accordingly, the source/drain region 116b and the second gate electrode 107b can be electrically connected by the metal silicide layer 118b. A second source/drain region 116a is included in an active region opposite the drain region 116b.

The first and second gate electrodes 107a and 107b may correspond to the gate electrodes of the access transistor and the driver transistor, respectively, of an SRAM cell. Also, the source/drain regions 116a and 116b may correspond to the source/drain regions of an access transistor. Particularly, the source/drain region 116b may also correspond to the drain region of the driver transistor. Thus, the metal silicide layer 118b electrically connects the drain region of the driver transistor and the second gate electrode 107b corresponding to the gate electrode of the driver transistor. Also, an interconnection 124 is present on a predetermined area of the butted metal silicide layer 118b. A plug pattern 122 may be interposed between the metal silicide layer 118b and the interconnection 124. Preferably, the plug pattern 122 comprises a doped polysilicon layer and/or a tungsten (W) layer.

As described above, in integrated circuits and fabrication methods according to the invention, after removing a sidewall spacer at the sidewall of a second gate electrode, the second gate electrode and a source/drain region adjacent thereto are connected by a metal silicide layer. Thus, deterioration in the junction leakage current characteristic of the source/drain region can be prevented, and contact resistance can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:

an integrated circuit substrate;

first and second spaced apart gate electrodes on the integrated circuit substrate, the first gate electrode including a first sidewall facing the second gate electrode and the second gate electrode including a second sidewall facing the first gate electrode;

a source/drain region in the integrated circuit substrate between the first and second spaced apart gate electrodes;

a first sidewall spacer on a first sidewall, the second sidewall being free of a sidewall spacer thereon; and a metal silicide layer on the first gate electrode, on the second gate electrode, and extending from the second gate electrode onto the second sidewall and onto the source/drain region, the first sidewall spacer being free of the metal silicide layer thereon.

2. An integrated circuit according to claim 1 wherein the source/drain region comprises:

a lightly doped source/drain region in the integrated circuit substrate between the first and second sidewalls; and a heavily doped source/drain region in the integrated circuit substrate between the first sidewall spacer and the second sidewall.

3. An integrated circuit according to claim 1 wherein the integrated circuit substrate comprises silicon, wherein the first and second gate electrodes comprise polysilicon and wherein the first sidewall spacer comprises at least one of silicon dioxide and silicon nitride.

4. An integrated circuit according to claim 1 wherein the metal silicide layer comprises a titanium silicide layer of C-54 phase on the first gate electrode, on the second gate electrode, and extending from the second gate electrode onto the second sidewall and onto the source/drain region.

5. An integrated circuit according to claim 1 wherein the metal silicide layer comprises at least one of titanium, cobalt, platinum, palladium and nickel.

6. An integrated circuit according to claim 1 further comprising:

a conductive plug that electrically contacts the metal silicide layer on the second gate electrode, on the second sidewall and on the source/drain region.

7. An integrated circuit comprising:

an integrated circuit substrate;

first and second spaced apart electrodes on the integrated circuit substrate, the first electrode including a first sidewall facing the second electrode and the second electrode including a second sidewall facing the first electrode;

a doped region in the integrated circuit substrate between the first and second spaced apart electrodes;

a first sidewall spacer on a first sidewall, the second sidewall being free of a sidewall spacer thereon; and a metal silicide layer on the first electrode, on the second electrode, and extending from the second electrode onto the second sidewall and onto the doped region, the first sidewall spacer being free of the metal silicide layer thereon.

8. An integrated circuit according to claim 7 wherein the doped region comprises:

a lightly doped region in the integrated circuit substrate between the first and second sidewalls; and a heavily doped region in the integrated circuit substrate between the first sidewall spacer and the second sidewall.

9. An integrated circuit according to claim 7 wherein the integrated circuit substrate comprises silicon, wherein the first and second electrodes comprise polysilicon and wherein the first sidewall spacer comprises at least one of silicon dioxide and silicon nitride.

10. An integrated circuit according to claim 7 wherein the metal silicide layer comprises a metal silicide layer of C-54 phase on the first electrode, on the second electrode, and extending from the second electrode onto the second sidewall and onto the doped region.

11. An integrated circuit according to claim 7 wherein the metal silicide layer comprises at least one of titanium, cobalt, platinum, palladium and nickel.

12. An integrated circuit according to claim 7 further comprising:

a conductive plug that electrically contacts the metal silicide layer on the second electrode, on the second sidewall and on the doped region.

* * * * *